US010866475B2

(12) United States Patent
Saitoh

(10) Patent No.: US 10,866,475 B2
(45) Date of Patent: Dec. 15, 2020

(54) ACTIVE MATRIX SUBSTRATE AND DISPLAY DEVICE

(71) Applicant: Sharp Kabushiki Kaisha, Sakai (JP)

(72) Inventor: Yuhichi Saitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/493,337

(22) PCT Filed: Mar. 15, 2018

(86) PCT No.: PCT/JP2018/010132
§ 371 (c)(1),
(2) Date: Sep. 12, 2019

(87) PCT Pub. No.: WO2018/168984
PCT Pub. Date: Sep. 20, 2018

(65) Prior Publication Data
US 2020/0124899 A1   Apr. 23, 2020

(30) Foreign Application Priority Data
Mar. 17, 2017   (JP) .................. 2017-053699

(51) Int. Cl.
G02F 1/1362   (2006.01)
H01L 29/786   (2006.01)

(52) U.S. Cl.
CPC .... G02F 1/13624 (2013.01); G02F 1/136286 (2013.01); H01L 29/7869 (2013.01);
(Continued)

(58) Field of Classification Search
None
See application file for complete search history.

(56) References Cited

U.S. PATENT DOCUMENTS

2010/0051949 A1   3/2010   Yamazaki et al.
2011/0109351 A1   5/2011   Yamazaki et al.
(Continued)

FOREIGN PATENT DOCUMENTS

JP   2010-080952 A   4/2010
JP   2011-119714 A   6/2011
(Continued)

OTHER PUBLICATIONS

Official Communication issued in International Patent Application No. PCT/JP2018/010132, dated Jun. 19, 2018.

Primary Examiner — Angel Roman
(74) Attorney, Agent, or Firm — Keating & Bennett, LLP

(57) ABSTRACT

An active matrix substrate according to an aspect of the disclosure includes a pixel portion including a plurality of gate lines and a plurality of source lines, and a plurality of pixel electrodes, and a split switch circuit configured to split a signal from a source driver to supply to the plurality of source lines, wherein the pixel portion includes a first TFT including a first oxide semiconductor layer, the split switch circuit includes a second TFT including a second oxide semiconductor layer and a third oxide semiconductor layer, and the third oxide semiconductor layer covers at least a portion of an upper face and a portion of an edge face of the second oxide semiconductor layer.

5 Claims, 17 Drawing Sheets

(52) U.S. Cl.
CPC ............ *G02F 2001/136245* (2013.01); *G02F 2201/123* (2013.01)

(56) References Cited

U.S. PATENT DOCUMENTS

| | | | |
|---|---|---|---|
| 2011/0273223 A1* | 11/2011 | Sakamoto | ............ G09G 3/3648 327/427 |
| 2012/0012847 A1 | 1/2012 | Koyama et al. | |
| 2012/0319183 A1 | 12/2012 | Yamazaki et al. | |
| 2013/0038518 A1 | 2/2013 | Tagawa et al. | |
| 2014/0001465 A1 | 1/2014 | Yamazaki | |
| 2014/0034945 A1 | 2/2014 | Tokunaga et al. | |
| 2016/0266451 A1 | 9/2016 | Koide et al. | |

FOREIGN PATENT DOCUMENTS

| | | |
|---|---|---|
| JP | 2011-139056 A | 7/2011 |
| JP | 2013-021315 A | 1/2013 |
| JP | 2014-030001 A | 2/2014 |
| JP | 2014-045173 A | 3/2014 |
| JP | 2016-170293 A | 9/2016 |
| WO | 2011/118079 A1 | 9/2011 |

* cited by examiner

ACTIVE MATRIX SUBSTRATE AND DISPLAY DEVICE

TECHNICAL FIELD

Some aspects of the disclosure relate to an active matrix substrate and a display device.

This application claims priority from JP 2017-053699 A, filed on Mar. 17, 2017 in Japan, the entirety of which is incorporated by reference herein.

BACKGROUND ART

In recent years, thin film transistors provided with oxide semiconductors have attracted attention as switching elements used in electronic devices such as display devices. Hereinafter, the thin film transistor is abbreviated as TFT herein.

PTL 1 described below discloses a display device including a gate driver provided with a TFT using an oxide semiconductor and an analog switch for source line driving. In addition, PTL 2 described below discloses a TFT including a first oxide semiconductor layer, a second oxide semiconductor layer provided on the first oxide semiconductor layer, and a third oxide semiconductor layer provided on the second oxide semiconductor layer and covering a side surface of the second oxide semiconductor layer.

CITATION LIST

Patent Literature

PTL 1: JP 2011-139056 A
PTL 2: JP 2013-21315 A

SUMMARY

Technical Problem

The TFT described in PTL 2 includes a layered structure of a plurality of oxide semiconductor layers, and thus, a high field effect mobility can be obtained. However, even when a TFT having an oxide semiconductor layered structure of a plurality of oxide semiconductor layers is applied to a plurality of circuits on an active matrix substrate including the gate driver and analog switch for source line driving described in PTL 1, and the like, it is difficult to satisfy requirements such as a narrow bezel, power consumption reduction, and the like required for the display device.

One aspect of the disclosure has been made to solve the above problems, and an object of the disclosure is to provide a display device having advantages such as the narrow bezel, the reduced power consumption, and the like. Further, an object of the disclosure is to provide an active matrix substrate suitable for use in the display device described above.

Solution to Problem

In order to achieve the object described above, an active matrix substrate according to an aspect of the disclosure includes a pixel portion including a plurality of gate lines and a plurality of source lines intersecting each other, and a plurality of pixel electrodes provided in a matrix corresponding to the intersections between the plurality of gate lines and the plurality of source lines, and a split switch circuit configured to split a signal from a source driver to supply to the plurality of source lines, wherein the pixel portion includes a first TFT including a first oxide semiconductor layer, the split switch circuit includes a second TFT including a second oxide semiconductor layer and a third oxide semiconductor layer, and the third oxide semiconductor layer covers at least a portion of an upper face and a portion of an edge face of the second oxide semiconductor layer.

In the active matrix substrate according to an aspect of the disclosure, a carrier mobility of the second oxide semiconductor layer may be greater than a carrier mobility of the third oxide semiconductor layer.

In the active matrix substrate according to an aspect of the disclosure, the first oxide semiconductor layer may be formed of the same material as the third oxide semiconductor layer.

In the active matrix substrate according to an aspect of the disclosure, a threshold voltage of the second TFT may be less than a threshold voltage of the first TFT.

In the active matrix substrate according to an aspect of the disclosure, a threshold voltage of the second TFT may be a negative value.

In the active matrix substrate according to an aspect of the disclosure, a threshold voltage of the first TFT may be a positive value.

In the active matrix substrate according to an aspect of the disclosure, the second TFT may further include a fourth oxide semiconductor layer on an upper layer side of the second oxide semiconductor layer, the fourth oxide semiconductor layer covering the third oxide semiconductor layer, and the upper face and the edge face of the second oxide semiconductor layer.

In the active matrix substrate according to an aspect of the disclosure, the second TFT may have a double gate structure.

A display device according to one aspect of the disclosure includes the active matrix substrate according to one aspect of the disclosure.

Advantageous Effects of Disclosure

According to an aspect of the disclosure, a display device can be provided that gives advantages such as a narrow bezel, reduced power consumption, and the like. In addition, according to an aspect of the disclosure, an active matrix substrate suitable for use in the display device described above can be provided.

DESCRIPTION OF EMBODIMENTS

First Embodiment

Hereinafter, a first embodiment of the disclosure will be described with reference to FIG. 1 to FIG. 5B.

A display device of the present embodiment is an example of a liquid crystal display device.

Figure 1:
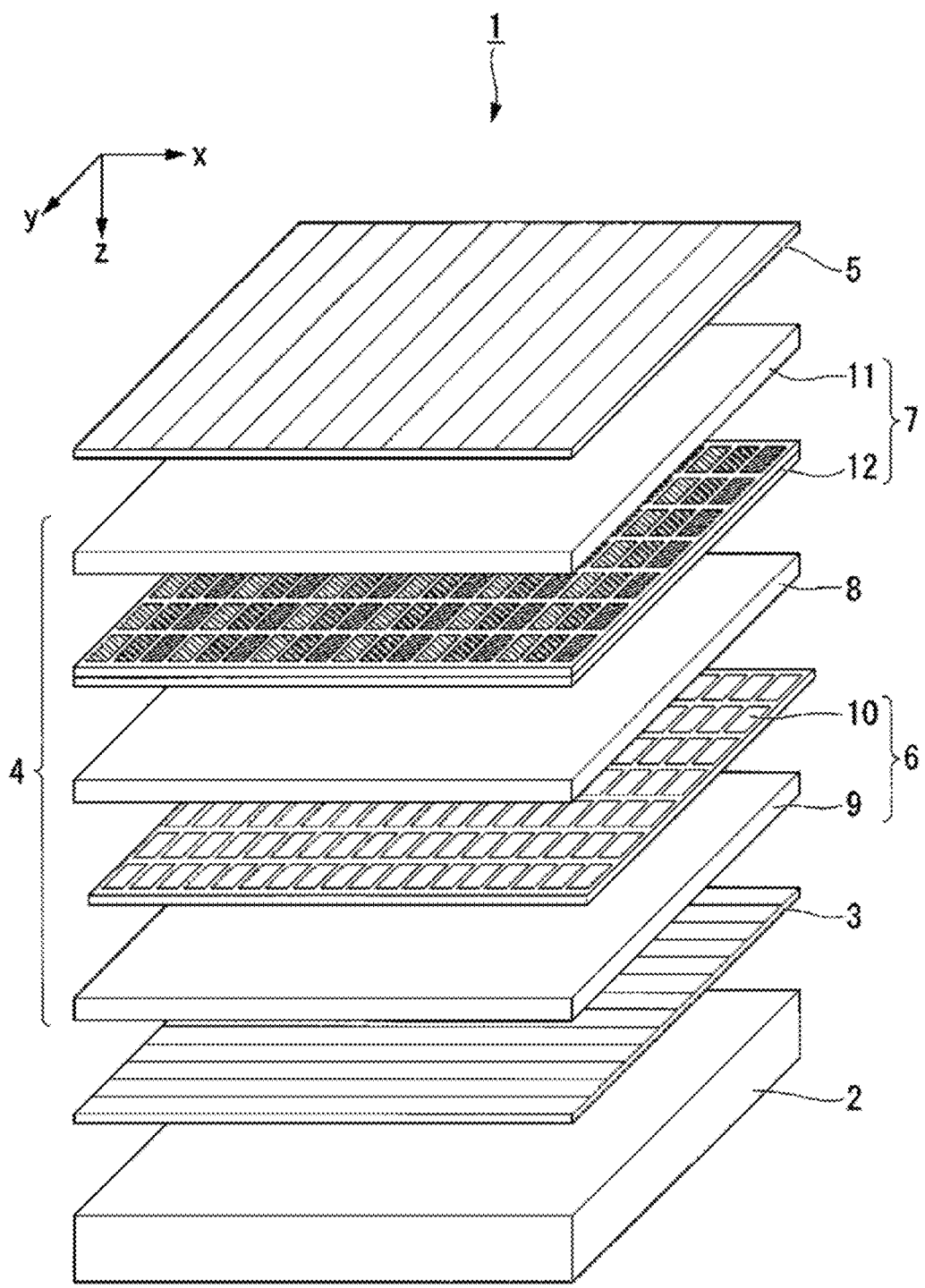
FIG. 1 is an exploded perspective view illustrating a schematic configuration of a liquid crystal display device of a first embodiment.

FIG. 1 is an exploded perspective view illustrating a schematic configuration of a liquid crystal display device of the first embodiment.

Note that for the purpose of easy viewing of components in the following drawings, different scales of size may be used for illustration depending on the components.

As illustrated in FIG. 1, a liquid crystal display device 1 includes a backlight 2, a polarization plate 3, a liquid crystal cell 4, and a polarization plate 5 in this order from a back side viewed from an observer (or, a lower side in FIG. 1). As described above, the liquid crystal display device 1 is a transmissive liquid crystal display device including the backlight 2. The liquid crystal display device 1 controls a transmittance of light emitted from the backlight 2 by the liquid crystal cell 4 to perform displaying.

In the following description, a left and right direction of a screen when the observer views the liquid crystal display device 1 is referred to as a horizontal direction, and an up and down direction of the screen is referred to as a vertical direction. The horizontal direction is an x-axis direction, the vertical direction is a y-axis direction, and a thickness direction of the liquid crystal display device is a z-axis direction. The x-axis direction, the y-axis direction, and the z-axis direction are orthogonal to each other.

The liquid crystal cell 4 is provided with a pair of substrates including an active matrix substrate 6 and a color filter substrate 7 disposed facing each other. The active matrix substrate 6 and the color filter substrate 7 are bonded together by a sealing member (not illustrated), and a liquid crystal layer 8 is sandwiched between the active matrix substrate 6 and the color filter substrate 7. A positive liquid crystal material or a negative liquid crystal material may be used for the liquid crystal layer 8.

The active matrix substrate 6 includes a plurality of subpixels 10 arranged in a matrix on a substrate 9. A plurality of pixels are configured by the subpixels 10, and a display region (screen) is constituted by a plurality of pixels. The color filter substrate 7 includes a color filter 12 on a transparent substrate 11.

Figure 2:
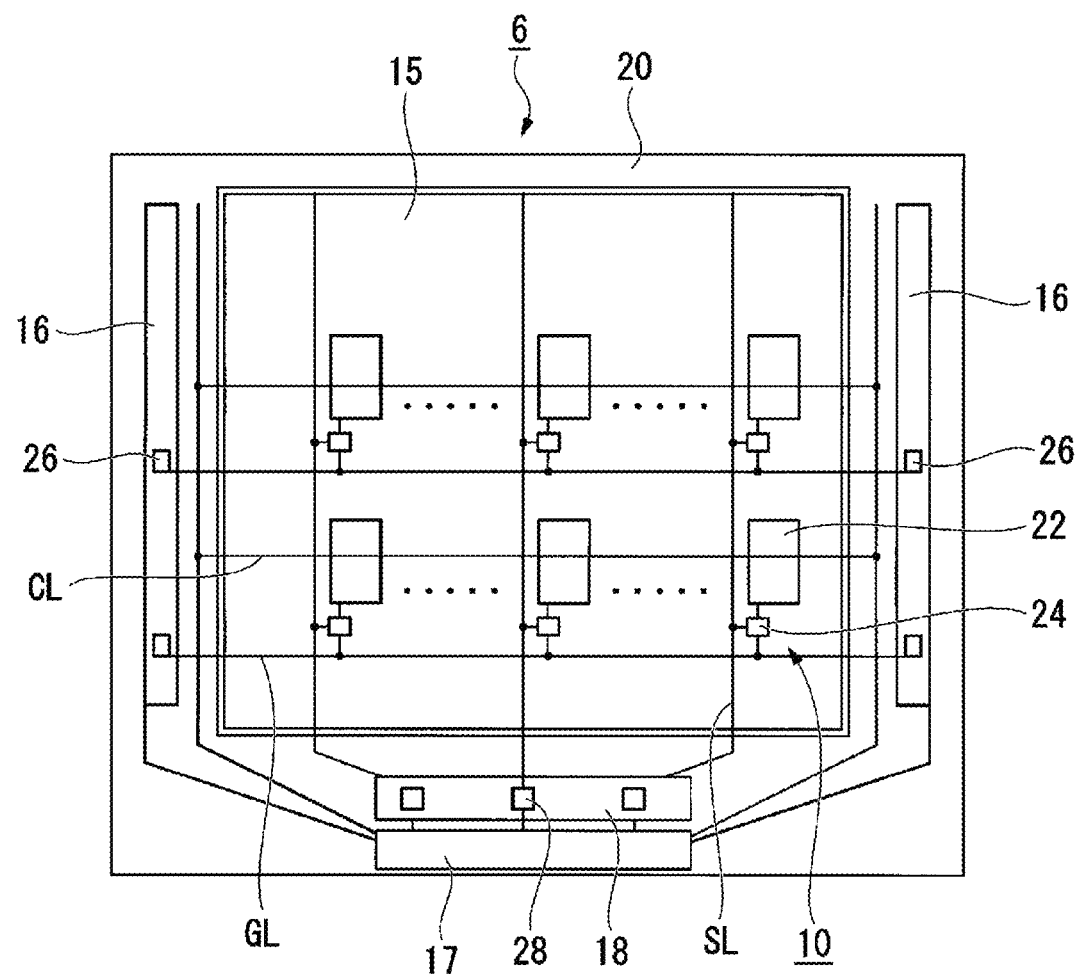
FIG. 2 is a schematic configuration diagram of an active matrix substrate.

FIG. 2 is a schematic configuration diagram of the active matrix substrate 6.

As illustrated in FIG. 2, the active matrix substrate 6 includes a pixel portion 15, a gate driver circuit 16, a source driver IC 17, and a split switch circuit 18. The pixel portion 15 is provided in a central region of a substrate 20. The gate driver circuit 16, the source driver IC 17, and the split switch circuit 18 are provided in a peripheral region of the substrate 20.

The pixel portion 15 includes a plurality of source lines SL arranged parallel to each other and a plurality of gate lines GL arranged parallel to each other. A plurality of source lines SL and a plurality of gate lines GL intersect each other. The pixel portion 15 is partitioned into a lattice shape by a plurality of source lines SL and a plurality of gate lines GL, and each of the partitioned substantially rectangular regions is a subpixel 10. A color pattern of any one of red (R), green (G), and blue (B) of the color filter 12 corresponds to one subpixel 10. One pixel is configured by three subpixels of red (R), green (G), and blue (B).

Each of a plurality of pixel electrodes 22 corresponds to each of a plurality of subpixels 10, and is provided in a matrix corresponding to each of the intersections between a plurality of gate lines GL and a plurality of source lines SL. Each of a plurality of pixel electrodes 22 is connected to both one source line SL and one gate line GL via a TFT 24. A gate electrode and a source electrode of the TFT 24 described later are connected to the gate line GL and the source line SL, respectively. A plurality of capacitor lines CL are provided parallel to a plurality of gate lines GL. The capacitor line CL is provided for the purpose of forming a capacitance (not illustrated) with each of the pixel electrodes 22 to stabilize a potential of the pixel electrode 22.

The TFT 24 of the pixel portion 15 in the present embodiment corresponds to a first thin film transistor described in the claims.

The gate driver circuit 16 includes a plurality of TFTs 26. The gate driver circuit 16 is provided in a monolithic manner on both end sides of the pixel portion 15, and supplies a scanning signal to a plurality of gate lines GL. A typical gate driver circuit is used for the gate driver circuit 16, and thus, detailed descriptions of the gate driver circuit 16 will be omitted.

The source driver IC 17 is mounted in the peripheral region of the substrate 20. The source driver IC 17 supplies an image signal to a plurality of source lines SL. A typical source driver IC is used for the source driver IC 17, and thus, detailed descriptions of the source driver IC 17 will be omitted.

Figure 3:
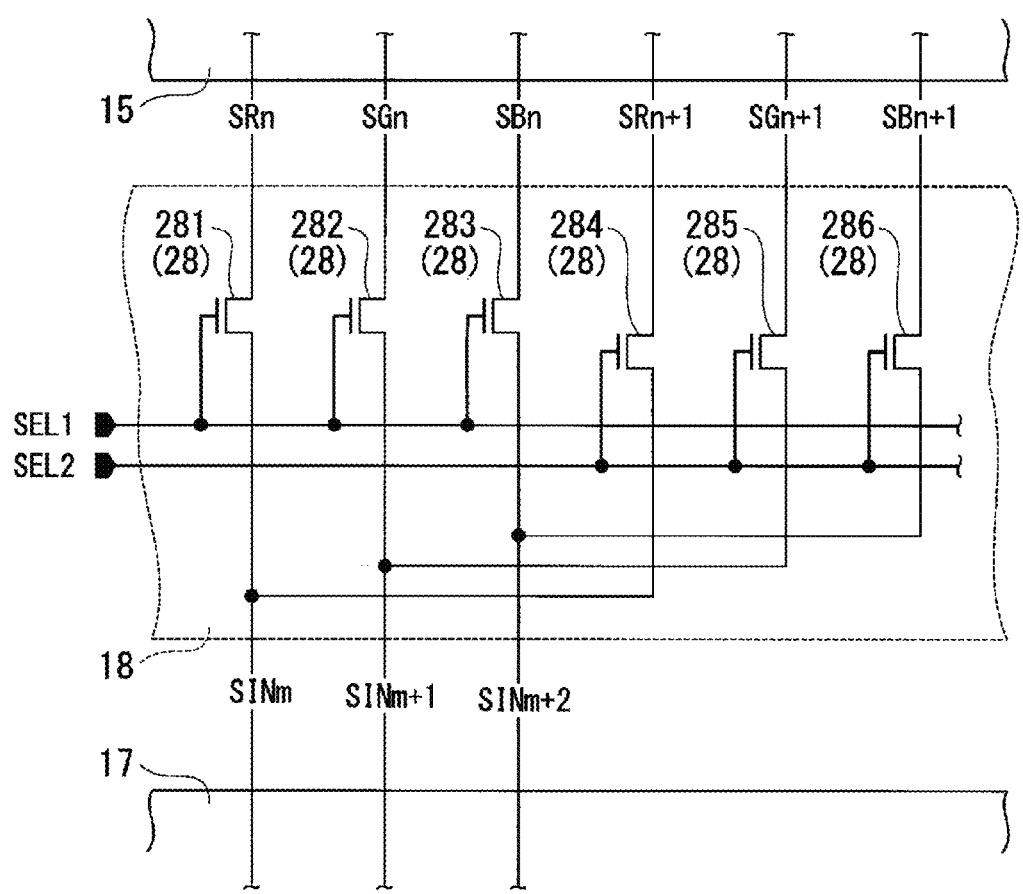
FIG. 3 is an equivalent circuit diagram of a split switch circuit.

FIG. 3 is an equivalent circuit diagram of the split switch circuit 18.

As illustrated in FIG. 3, the split switch circuit 18 includes TFTs 28 connected to a plurality of source lines $SR_n$, $SG_n$, $SB_n$, $SG_{n+1}$, $SB_{n+1}$ via drain electrodes. Among a plurality of TFTs 28, gate electrodes of TFTs 281 to 283 are connected to a control line SEL1, and gate electrodes of TFTs 284 to 286 are connected to a control line SEL2. Source electrodes of the TFTs 281 and 284 are connected to an output line $SIN_m$ from the source driver IC 17, source electrodes of the TFTs 282 and 285 are connected to an output line $SIN_{m+1}$, and sources of the TFTs 283 and 286 are connected to an output line $SIN_{m+2}$.

In the split switch circuit 18 having the configuration described above, a switching signal is supplied to the control lines SEL1 and SEL2 so that one set of a set of three TFTs 281 to 283 connected to the identical control line SEL1 and a set of three TFTs 284 to 286 connected to the identical control line SEL2 simultaneously turns to an ON state for a predetermined period of time, and the other set turns to an OFF state, and then, the ON and OFF states are switched every predetermined period of time. In this way, the image signals supplied from the output lines $SIN_m$, $SIN_{m+1}$, and $SIN_{m+2}$ of the source driver IC 17 are output in a time-division manner to a plurality of source lines $SR_n$, $SG_n$, $SB_n$, $SR_{n+1}$, $SG_{n+1}$, and $SB_{n+1}$ via the TFTs 281 to 286, respectively.

Figure 4A:
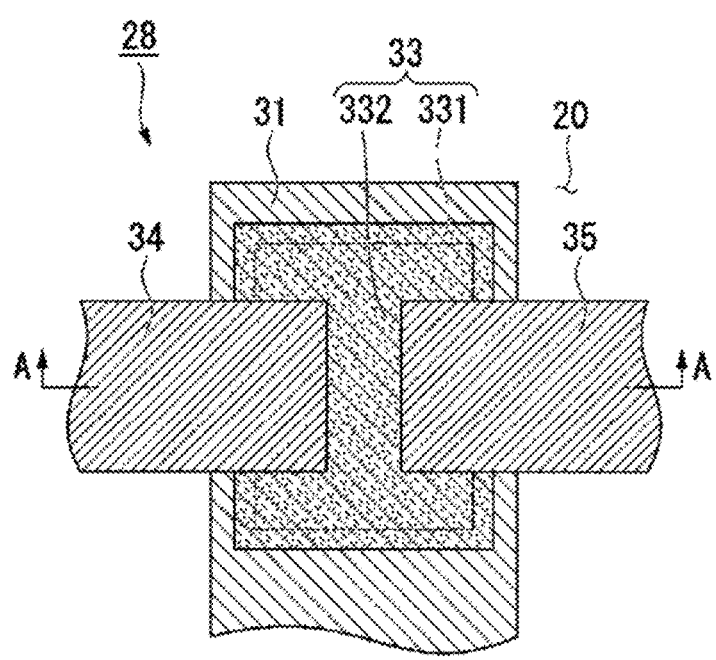
FIG. 4A is a plan view illustrating a pattern of a split switch circuit TFT.

FIG. 4A is a plan view illustrating a pattern of a split switch circuit TFT.

As illustrated in FIG. 4A, in the TFT 28, an oxide semiconductor layer 33 including a second oxide semiconductor layer 331 and a third oxide semiconductor layer 332 is provided to overlap a gate electrode 31. The third oxide semiconductor layer 332 covers all of an upper face and an edge face of the second oxide semiconductor layer 331. A portion of a source electrode 34 and a portion of a drain electrode 35 are provided to overlap a portion of the oxide semiconductor layer 33.

Note that in the plan view illustrating the following TFT patterns including FIG. 4A, a gate insulating layer 32 and a protection layer 36 are not illustrated.

Figure 4B:
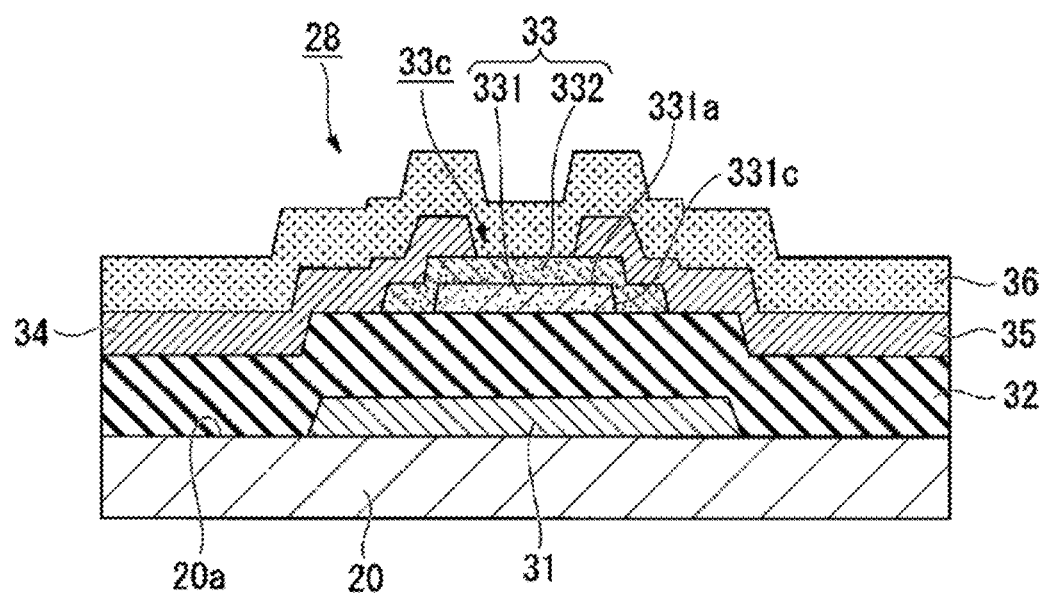
FIG. 4B is a cross-sectional view taken along a line A-A in FIG. 4A.

FIG. 4B is a cross-sectional view taken along a line A-A' in FIG. 4A.

As illustrated in FIG. 4B, the TFT 28 is provided on a first surface 20a of the substrate 20. The TFT 28 includes the gate electrode 31, the gate insulating layer 32, the oxide semiconductor layer 33, the source electrode 34, and the drain electrode 35. The TFT 28 in the present embodiment includes a bottom gate channel etched type TFT.

The gate electrode 31 is formed on the first surface 20a of the substrate 20. The gate electrode 31 is formed of a layered film of W (tungsten)/Ta (tantalum), for example. The gate insulating layer 32 is formed on the first surface 20a of the substrate 20 to cover the gate electrode 31. The gate insulating layer 32 is formed of a layered film of $SiO_2$ (silicon oxide layer)/$SiN_x$ (silicon nitride layer), for example.

The oxide semiconductor layer 33 is formed on the gate insulating layer 32. The oxide semiconductor layer 33 has a dual-layer structure including the second oxide semiconductor layer 331 and the third oxide semiconductor layer 332. The third oxide semiconductor layer 332 is provided to cover an upper face 331a and an edge face 331c of the second oxide semiconductor layer 331, and further extend toward lateral sides of the edge face 331c.

The oxide semiconductor layer 33 is formed from, for example, an In—Ga—Zn—O-based oxide semiconductor. An etch stop layer is not formed on a channel region 33c of the oxide semiconductor layer 33, and lower faces of end portions of the source electrode 34 and drain electrode 35 closer to the channel region 33c are disposed to be in contact with an upper face of the oxide semiconductor layer 33.

The source electrode 34 and the drain electrode 35 are formed of three layered metal films of Ti (titanium)/Al (aluminum)/Ti (titanium), for example. As described in the present embodiment, the channel etched type TFT 28 is formed by forming a conductive film for the source and drain electrodes on the oxide semiconductor layer 33, and performing source/drain separation, for example.

An oxide semiconductor constituting the oxide semiconductor layer 33 may be an amorphous oxide semiconductor, or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer 33 may include an amorphous oxide semiconductor layer and a crystalline oxide semiconductor layer. Alternatively, the oxide semiconductor layer 33 may include a plurality of crystalline oxide semiconductor layers having different crystal structures, or a plurality of amorphous oxide semiconductor layers.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer 33 may include, for example, at least one metal element selected from In, Ga, and Zn. In the present embodiment, the oxide semiconductor layer 33 includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and an atomic ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer 33 can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which the c-axis is oriented substantially perpendicular to the layer surface is preferable as the crystalline In—Ga—Zn—O based semiconductor. The TFT 28 including the In—Ga—Zn—O based oxide semiconductor layer 33 has high mobility (more than 20 times in comparison with a-Si TFTs) and low leakage current (less than 1/100th in comparison with a-Si TFTs).

Note that the crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference.

The oxide semiconductor layer 33 may include another oxide semiconductor in place of the In—Ga—Zn—O based semiconductor. For example, the oxide semiconductor layer 33 may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer 33 may include an In—Ga—Zn—Sn—O based semiconductor having a configuration in which $SnO_2$ is added to an In—Ga—Zn—O based semiconductor ($In_2O_3$—$Ga_2O_3$—ZnO—$SnO_2$; InGaZnSnO, for example). Alternatively, the oxide semiconductor layer 33 may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, or an Hf—In—Zn—O based semiconductor.

Each of the second oxide semiconductor layer 331 and the third oxide semiconductor layer 332 is selected appropriately from the oxide semiconductor materials described above, but is preferably selected such that a carrier mobility of the second oxide semiconductor layer 331 is greater than a carrier mobility of the third oxide semiconductor layer 332. As an example of a combination of materials, an In—Sn—Zn—O based semiconductor can be used as the second oxide semiconductor layer 331, for example, and an In—Ga—Zn—O based semiconductor can be used as the third oxide semiconductor layer 332, for example. The carrier mobility of the In—Sn—Zn—O based semiconductor is higher than the carrier mobility of the In—Ga—Zn—O based semiconductor. This allows the TFT 28 having a high carrier mobility and a low threshold voltage to be obtained, and an ON-current of the TFT 28 to increase.

As another example of the combination, an In—Ga—Zn—Sn—O based semiconductor can be used as the second oxide semiconductor layer 331, for example, and an In—Ga—Zn—O based semiconductor can be used as the third oxide semiconductor layer 332, for example. This allows the TFT 28 having a high carrier mobility and a low threshold voltage to be obtained, and an ON-current of the TFT 28 to increase.

Here, the reason for using an In—Ga—Zn—O based semiconductor for the third oxide semiconductor layer 332 in above two combinations for the second oxide semiconductor layer 331 and the third oxide semiconductor layer 332 is because an In—Ga—Zn—O based semiconductor is excellent in process tolerability to channel etching in the source/drain electrode formation process or the like, and thus, can withstand a mass production process. The third oxide semiconductor layer 332 mainly serves to ensure the process tolerability, and the second oxide semiconductor layer 331 mainly serves to achieve the high TFT mobility.

As another combination, an In—Ga—Zn—O based semiconductor different in a composition ratio thereof can be used. An In—Ga—Zn—O based semiconductor having a composition ratio of In:Ga:Zn=1.2:1:1 can be used as the second oxide semiconductor layer 331, for example, and an In—Ga—Zn—O based semiconductor having a composition ratio of In:Ga:Zn=1:1:1 can be used as the third oxide semiconductor layer 332, for example. In an In—Sn—Zn—O based semiconductor, the carrier mobility can be increased by increasing the content of In. This allows the TFT 28 having a high carrier mobility and a low threshold voltage to be obtained, and an ON-current of the TFT 28 to increase.

More specifically, as for an atomic ratio of indium to the total amount of indium, gallium, and zinc [In]/([In]+[Ga]+[Zn]), an atomic ratio of indium in the second oxide semiconductor layer 331 is preferably greater than an atomic ratio of indium in the third oxide semiconductor layer 332.

Here, since the second oxide semiconductor layer 331 contains more In than In in the third oxide semiconductor layer 332, the carrier mobility is increased, whereas a ratio of Ga or Zn is relatively small, so the process tolerability described above is low. Therefore, in the present embodiment, the second oxide semiconductor layer 331 is covered by the third oxide semiconductor layer 332, thereby protecting the second oxide semiconductor layer 331 to improve the process tolerability.

Among constituent elements of the In—Ga—Zn—O based semiconductor, it is said that In has an effect of improving electrical conductivity, Ga has an effect of suppressing oxygen deficiency, and Zn has an effect of stabilizing an amorphous structure. It has been considered that both electrical characteristics and acid resistance can be achieved by adding new elements to these elements. The entire disclosed contents of "BCE type TFT-capable oxide semiconductor material", Mori, and two others, Kobe Steel Report, Kobe Steel, Ltd., 65th vol., No. 2, p. 72-77, Sep. 30, 2015, is incorporated herein as reference.

The protection layer 36 is formed to cover the source electrode 34 and the drain electrode 35.

The protection layer 36 may be formed of a layered film of $SiO_2$ (silicon oxide film)/$SiN_x$ (silicon nitride film), for example, or may be a single layer film of any one of these layers.

Figure 5A:
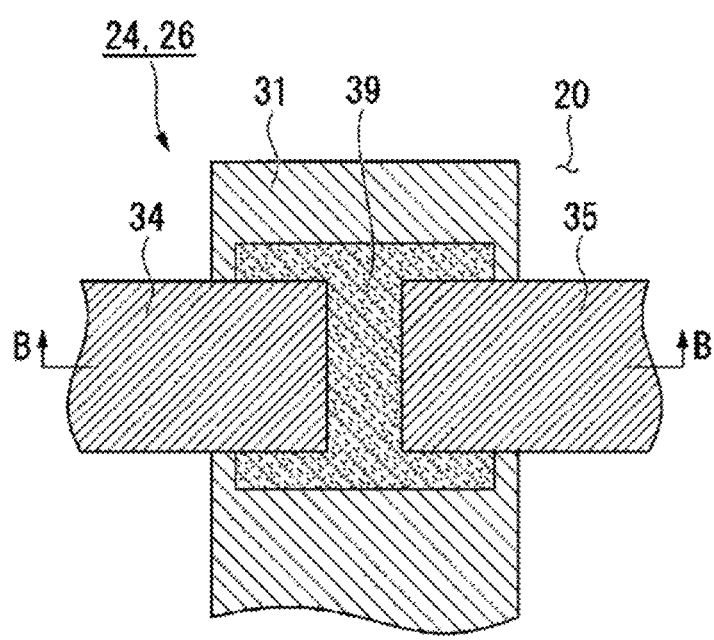
FIG. 5A is a plan view illustrating a pattern of both a pixel portion TFT and a gate driver circuit TFT.

FIG. 5A is a plan view illustrating a pattern of both a pixel portion TFT and a gate driver circuit TFT. Note that in FIG. 5A, the same components as those in FIG. 4A are denoted by the same reference signs, and descriptions thereof will be omitted.

As illustrated in FIG. 5A, in the TFTs 24 and 26, a first oxide semiconductor layer 39 is provided to overlap the gate electrode 31. A portion of the source electrode 34 and a portion of the drain electrode 35 are provided to overlap a portion of the first oxide semiconductor layer 39. Note that in FIG. 5A, the gate insulating layer 32 and the protection layer 36 are not illustrated.

Figure 5B:
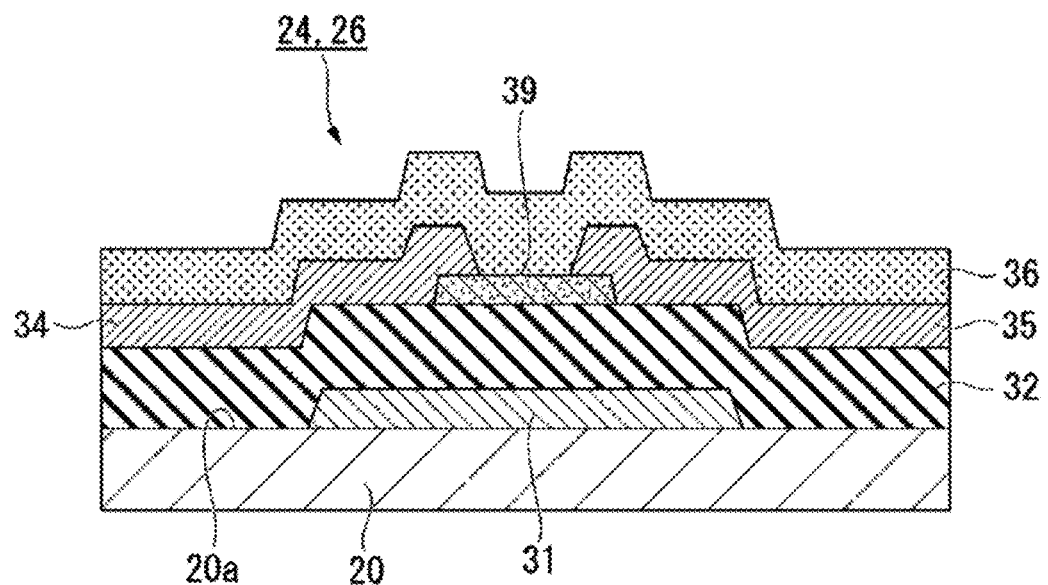
FIG. 5B is a cross-sectional view taken along a line B-B in FIG. 5A.

FIG. 5B is a cross-sectional view taken along a line B-B in FIG. 5A. Note that in FIG. 5B, the same components as those in FIG. 4B are denoted by the same reference signs, and descriptions thereof will be omitted.

The TFT 28 of the split switch circuit 18 includes the oxide semiconductor layer 33 having a dual-layer structure, whereas, as illustrated in FIG. 5B, the TFTs 24 and 26 of the pixel portion 15 and the gate driver circuit 16, respectively, include the first oxide semiconductor layer 39. The TFT 24 of the pixel portion 15 and the TFT 26 of the gate driver circuit 16 have the same configuration.

The first oxide semiconductor layer 39 in each of the TFTs 24 and 26 of the pixel portion 15 and the gate driver circuit 16, respectively, is formed from the same material as the third oxide semiconductor layer 332 in the TFT 28 of the split switch circuit 18. Specifically, the first oxide semiconductor layer 39 in each of the TFTs 24 and 26 of the pixel portion 15 and the gate driver circuit 16, respectively, is made of by the same material as the third oxide semiconductor layer 332 having the carrier mobility lower among the second oxide semiconductor layer 331 and the third oxide semiconductor layer 332 which are included in the TFT 28 of the split switch circuit 18.

The threshold voltage of the TFT 28 of the split switch circuit 18 is preferably a negative value in order to increase the ON-current. On the other hand, the TFT 26 of the gate driver circuit 16 may have a smaller ON-current than the TFT 28 of the split switch circuit 18, but the threshold voltage thereof is preferably a positive value. The TFT 24 of the pixel portion 15 may also have a smaller ON-current than the TFT 28 of the split switch circuit 18, but the threshold voltage thereof is preferably a positive value.

Note that the threshold voltage herein is defined as Vg when a value of Id×L/W is 1 nA (nanoamperes) in the Vg-Id characteristics (transmission characteristics) of the TFT.

Where Vg is a voltage applied to the gate electrode (gate voltage), Id is a current between the drain electrode and the source electrode (drain current), and a voltage applied to the source electrode (source voltage) is 0 V. L is a channel length of the TFT and W is a channel width of the TFT. Furthermore, a voltage Vd applied to the drain electrode (drain voltage) is 10 V, but the drain voltage may be appropriately selected within a range of those applied when the TFT is used as an active matrix substrate or a display device.

In the active matrix substrate, the TFT of the split switch circuit is required to have a greater ON-current than TFTs at other sites. For this reason, a size of the TFT of the split switch circuit in the known active matrix substrate tends to increase, becoming an obstacle to achieving a narrower bezel.

To address the above problem, in the case of the active matrix substrate 6 of the present embodiment, the TFT 28 of the split switch circuit 18 has the dual-layer structure of the second oxide semiconductor layer 331 and the third oxide semiconductor layer 332, in which the carrier mobility is relatively high on the lower layer side near the gate electrode 31 and the carrier mobility is relatively low on the upper layer side far from the gate electrode 31, and the threshold voltage is a negative value. This allows the size of the TFT 28 for obtaining the same degree of ON-current as in the related art can be made smaller than that in the related art.

Furthermore, because the upper face 331a and the edge face 331c of the second oxide semiconductor layer 331 are covered by the third oxide semiconductor layer 332, the second oxide semiconductor layer 331 is not damaged by channel etching in the source/drain electrode forming process. Furthermore, metal materials and impurities such as hydrogen, nitrogen, and oxygen contained in the source/drain electrodes are not easily diffused into the second oxide semiconductor layer 331, and thus, the characteristics thereof are not easily changed, and when patterning the third oxide semiconductor layer 332 on the upper layer side, the etchant does not touch the second oxide semiconductor layer 331. Therefore, the second oxide semiconductor layer 331 is not damaged by the etchant. This allows a function of the second oxide semiconductor layer 331 having the high carrier mobility to be more effectively exerted.

Similar to the split switch circuit 18, the gate driver circuit 16 can be configured using the TFT having a threshold voltage of a negative value. However, when the TFT having a threshold voltage of a negative value is used for the gate driver circuit 16, an average amount of current flowing through the interior of the gate driver circuit 16 increases, which has an adverse effect that power consumption increases.

In that regard, in the active matrix substrate 6 of the present embodiment, the gate driver circuit 16 is configured using the TFT 26 having a threshold voltage of a positive value, and thus, there is little possibility that the above adverse effect occurs. In the related art, the TFT of the split switch circuit and the TFT of the gate driver circuit have the same structure, and therefore, it was difficult to differentiate the characteristics of these TFTs. However, in the present embodiment, the TFT 28 of the split switch circuit 18 and the TFT 26 of the gate driver circuit 16 have different structures, and thus, it is relatively easy to differentiate the characteristics of these TFTs.

As described above, the threshold voltage of the TFT 28 of the split switch circuit 18 in the present embodiment is preferably a negative value, but, as another embodiment, the threshold voltage of the TFT 28 of the split switch circuit 18 may be smaller than the threshold voltage of the TFT 24 of the pixel portion 15 and the TFT 26 of the gate driver circuit 16. Even in this case, in the split switch circuit 18, the size of TFT 28 for obtaining the same degree of ON-current as in the related art can be made smaller than that in the related art.

The gate driver circuit 16 of the present embodiment need not be configured using only the TFT 26 having the threshold voltage of a positive value, and may be configured partially using the TFT having the threshold voltage of a negative value. In the present embodiment, the TFT 26 of the gate driver circuit 16 is described as having the same configuration as the TFT 24 of the pixel portion 15, but the TFT having the same configuration as the TFT 28 of the split switch circuit 18 may be used for some TFTs of the plurality of TFTs 26 constituting the gate driver circuit 16.

According to the present embodiment, by use of the active matrix substrate 6 described above, it is possible to provide the liquid crystal display device 1 having a narrow bezel and low power consumption.

Second Embodiment

Hereinafter, a second embodiment of the disclosure will be described with reference to FIG. 6A to FIG. 7B.

A basic configuration of an active matrix substrate of the present embodiment is the same as that of the first embodiment, and a configuration of a TFT is different from that of the first embodiment.

Figure 6A:
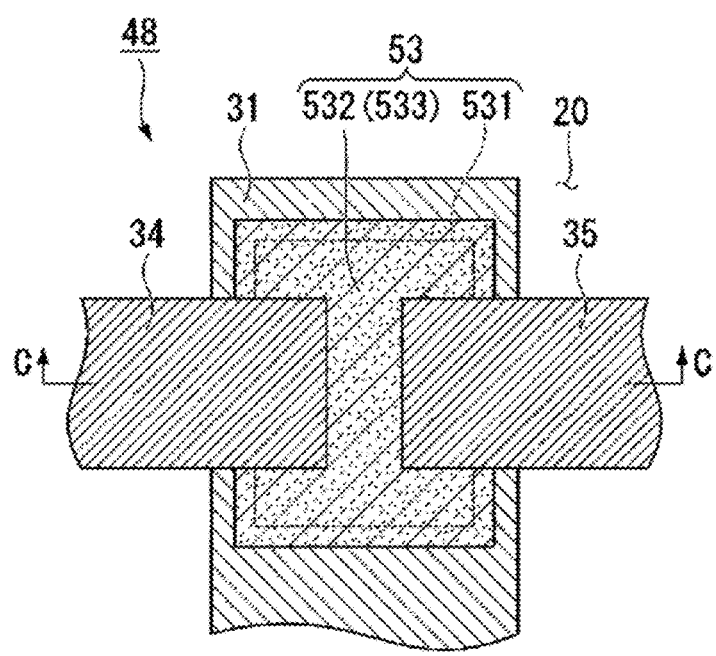
FIG. 6A is a plan view illustrating a pattern of a split switch circuit TFT in an active matrix substrate of a second embodiment.
Figure 6B:
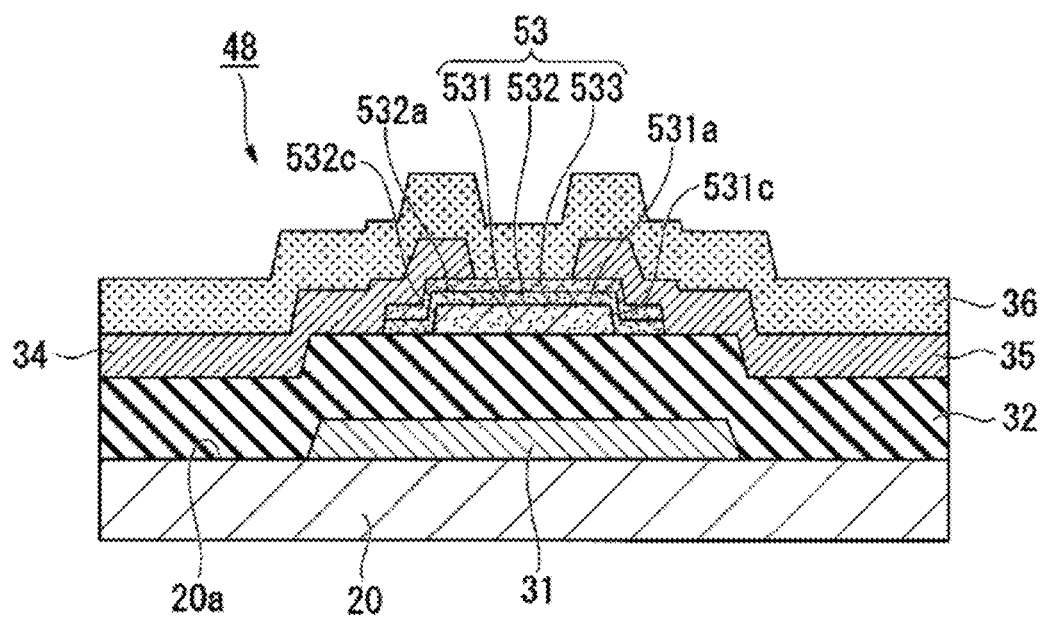
FIG. 6B is a cross-sectional view taken along a line C-C in FIG. 6A.

FIG. 6A is a plan view illustrating a pattern of a split switch circuit TFT in an active matrix substrate of the second embodiment. FIG. 6B is a cross-sectional view taken along a line C-C in FIG. 6A.

Figure 7A:
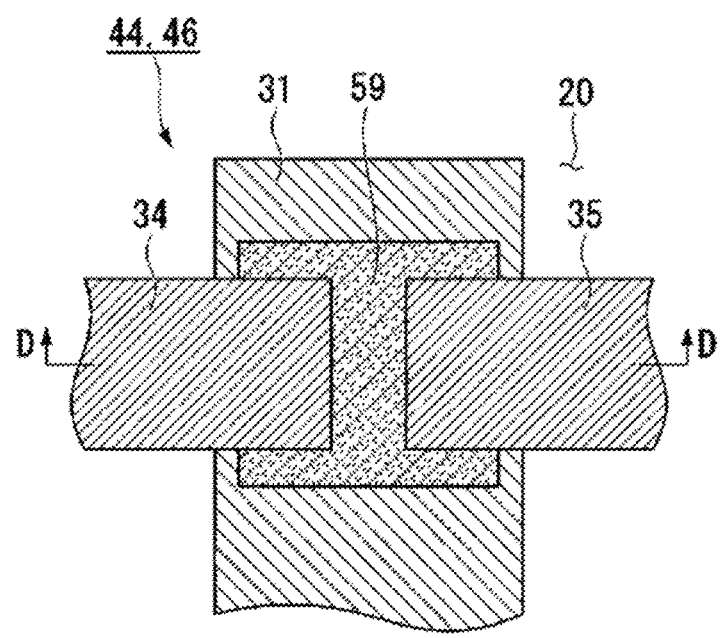
FIG. 7A is a plan view illustrating a pattern of both a pixel portion TFT and a gate driver circuit TFT.
Figure 7B:
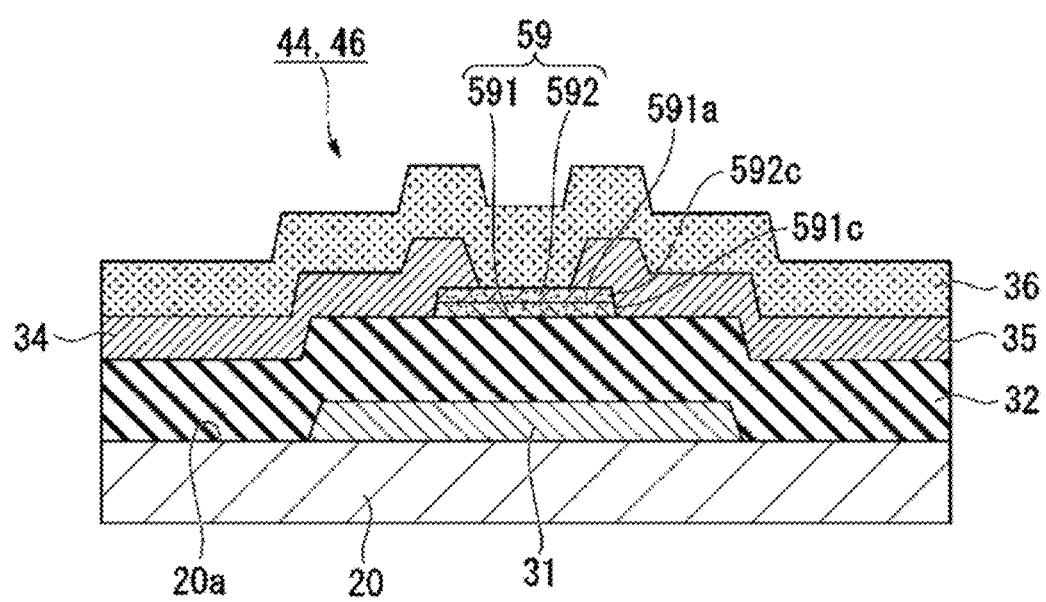
FIG. 7B is a cross-sectional view taken along a line D-D in FIG. 7A.

FIG. 7A is a plan view illustrating a pattern of both a pixel portion TFT and a gate driver circuit TFT. FIG. 7B is a cross-sectional view taken along a line D-D in FIG. 7A.

In FIG. 6A to FIG. 7B, the same components as those in the drawings used in the first embodiment are denoted by the same reference signs, and descriptions thereof will be omitted.

As illustrated in FIG. 6A, in a TFT 48 of the split switch circuit 18, an oxide semiconductor layer 53 including a second oxide semiconductor layer 531, a third oxide semiconductor layer 532, and a fourth oxide semiconductor layer 533 is provided to overlap the gate electrode 31. A portion of the source electrode 34 and a portion of the drain electrode 35 are provided to overlap a portion of the oxide semiconductor layer 53.

As illustrated in FIG. 6B, in the TFT 48 of the split switch circuit 18, the oxide semiconductor layer 53 is formed on the gate insulating layer 32. The oxide semiconductor layer 53 has a triple-layer structure including the second oxide semiconductor layer 531, the third oxide semiconductor layer 532, and the fourth oxide semiconductor layer 533.

The third oxide semiconductor layer 532 is provided to cover an upper face 531a and an edge face 531c of the second oxide semiconductor layer 531, and extends toward lateral sides of the edge face 531c. The fourth oxide semiconductor layer 533 is provided to cover an upper face 532a and an edge face 532c of the third oxide semiconductor layer 532, and further extend toward lateral sides of the edge face 532c. Specifically, the TFT 48 of the split switch circuit 18 further includes the fourth oxide semiconductor layer 533 on the upper layer side of the third oxide semiconductor layer 532 to cover the third oxide semiconductor layer 532, and the upper face 531a and the edge face 531c of the second oxide semiconductor layer 531.

As illustrated in FIG. 7A, in each of TFTs 44 and 46 of the pixel portion 15 and the gate driver circuit 16, respectively, an oxide semiconductor layer 59 is provided to overlap the gate electrode 31. A portion of the source electrode 34 and a portion of the drain electrode 35 are provided to overlap a portion of the oxide semiconductor layer 59.

As illustrated in FIG. 7B, in each of the TFTs 44 and 46 of the pixel portion 15 and the gate driver circuit 16, respectively, an oxide semiconductor layer 59 is formed on the gate insulating layer 32. The oxide semiconductor layer 59 has a dual-layer structure including a first oxide semiconductor layer 591 and a fifth oxide semiconductor layer 592. In the TFTs 44 and 46, an edge face 591c of the first oxide semiconductor layer 591 is not covered by the fifth oxide semiconductor layer 592, and the edge face 591c of the first oxide semiconductor layer 591 and an edge face 592c of the fifth oxide semiconductor layer 592 are aligned with each other. Other configurations are the same as those in the first embodiment.

In the present embodiment as well, the material of each of the second oxide semiconductor layer 531 and the third oxide semiconductor layer 532 in the TFT 48 is preferably selected such that a carrier mobility of the second oxide semiconductor layer 531 is greater than a carrier mobility of the third oxide semiconductor layer 532. A combination of the materials of two layers is the same as that in the first embodiment. Specifically, as an example of the combination of the materials, an In—Sn—Zn—O based semiconductor can be used as the second oxide semiconductor layer 531, for example, and an In—Ga—Zn—O based semiconductor can be used as the third oxide semiconductor layer 532, for example.

Alternatively, an In—Ga—Zn—Sn—O based semiconductor can be used as the second oxide semiconductor layer 531, for example, and an In—Ga—Zn—O based semiconductor can be used as the third oxide semiconductor layer 532, for example. Alternatively, an In—Ga—Zn—O based semiconductor having a composition ratio of In:Ga:Zn=1.2:1:1 can be used as the second oxide semiconductor layer 531, for example, and an In—Ga—Zn—O based semiconductor having a composition ratio of In:Ga:Zn=1:1:1 can be used as the third oxide semiconductor layer 532, for example.

Furthermore, a material that is not susceptible to the damage by channel etching in the source/drain electrode forming process is preferably used as the fourth oxide semiconductor layer 533. From this perspective, an In—Ga—Zn—O based semiconductor having a composition ratio of In:Ga:Zn=1:2:2 can be used as the fourth oxide semiconductor layer 533, for example. As described above, the fourth oxide semiconductor layer 533 may preferably include as the material more Ga and Zn, that is, including less indium, than those in the third oxide semiconductor layer 532, Ga and Zn contributing to the stability of the film, thereby to improve the process tolerability. More specifically, as for an atomic ratio of indium to the total amount of indium, gallium, and zinc $[In]/([In]+[Ga]+[Zn])$, an atomic ratio of indium in the fourth oxide semiconductor layer 533 is preferably smaller than an atomic ratio of indium in the third oxide semiconductor layer 532.

For the similar reasons, the material of the first oxide semiconductor layer 591 may be the same as the material of the third oxide semiconductor layer 532, and the material of the fifth oxide semiconductor layer 592 may be the same as the material of the fourth oxide semiconductor layer 533.

In the present embodiment as well, similar effects to those of the first embodiment can be obtained, such as a reduced occupancy area of the split switch circuit 18 and realizing the liquid crystal display device 1 having a narrow bezel and low power consumption.

In the case of the present embodiment, since the TFT 48 of the split switch circuit 18 includes the fourth oxide semiconductor layer 533, the effects can be obtained that the process tolerability of the TFT 48 is improved and the characteristics are stabilized.

Third Embodiment

Hereinafter, a third embodiment of the disclosure will be described with reference to FIG. 8A to FIG. 9B.

A basic configuration of the active matrix substrate of the present embodiment is the same as that of the first embodiment, and a configuration of the TFT is different from that of the first embodiment.

Figure 8A:
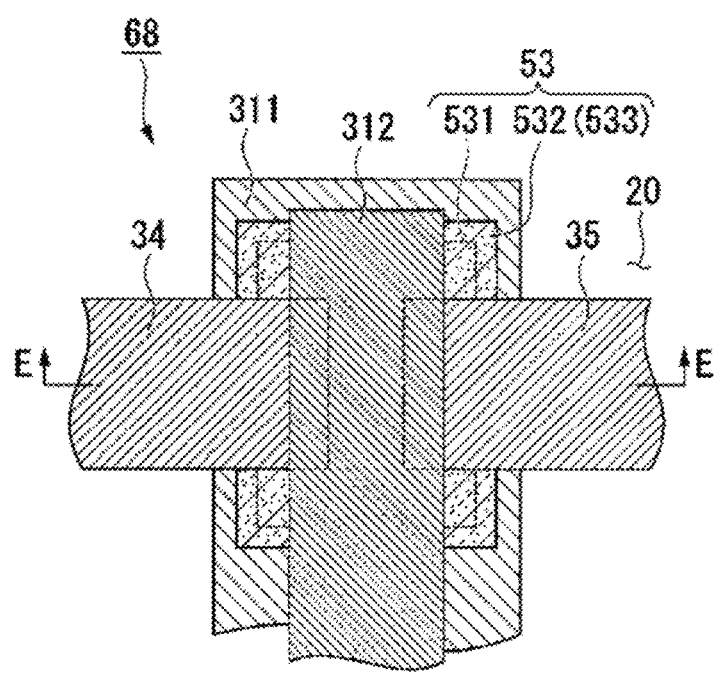
FIG. 8A is a plan view illustrating a pattern of a split switch circuit TFT in an active matrix substrate of a third embodiment.
Figure 8B:
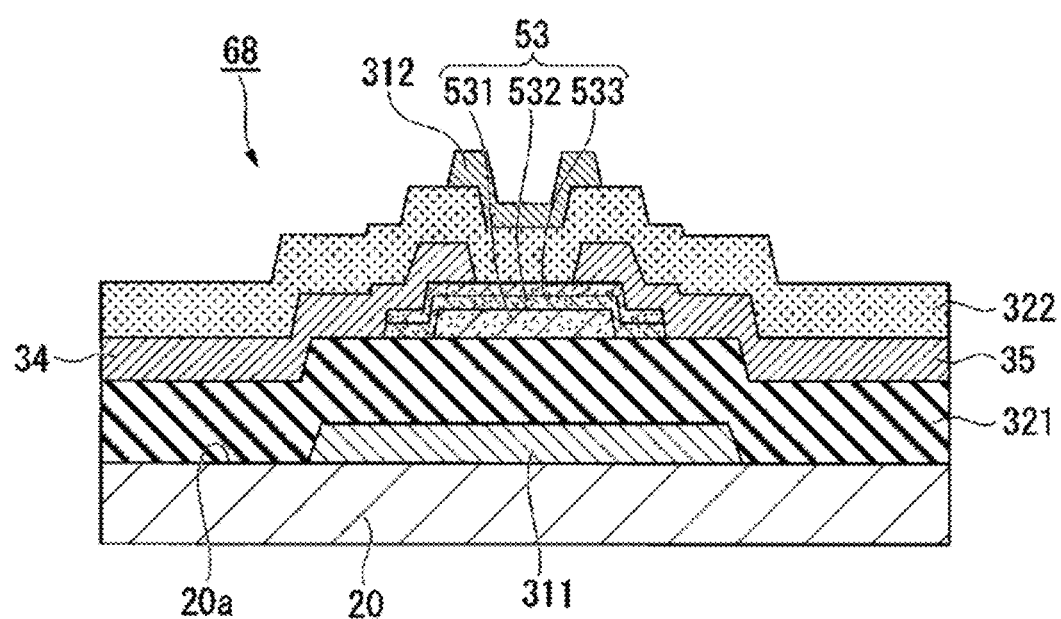
FIG. 8B is a cross-sectional view taken along a line E-E in FIG. 8A.

FIG. 8A is a plan view illustrating a pattern of a split switch circuit TFT in an active matrix substrate of the third embodiment. FIG. 8B is a cross-sectional view taken along a line E-E in FIG. 8A.

Figure 9A:
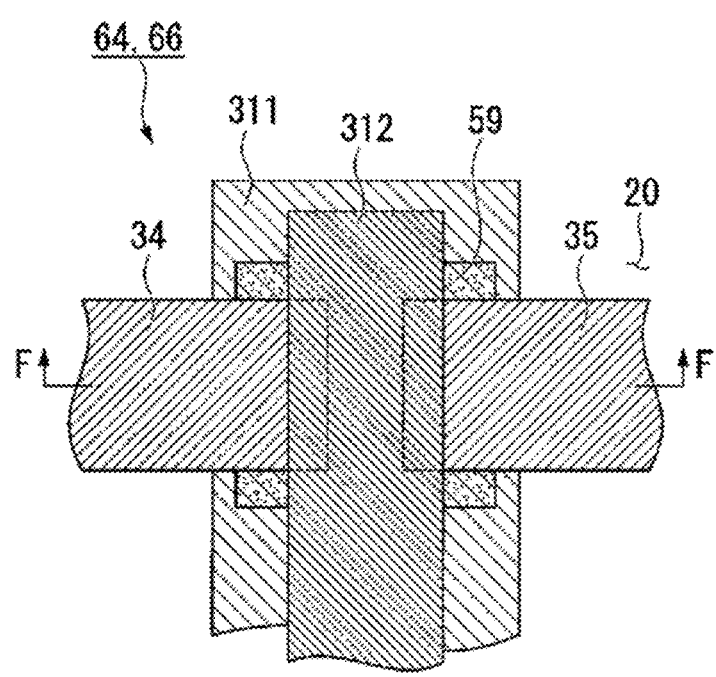
FIG. 9A is a plan view illustrating a pattern of both a pixel portion TFT and a gate driver circuit TFT.
Figure 9B:
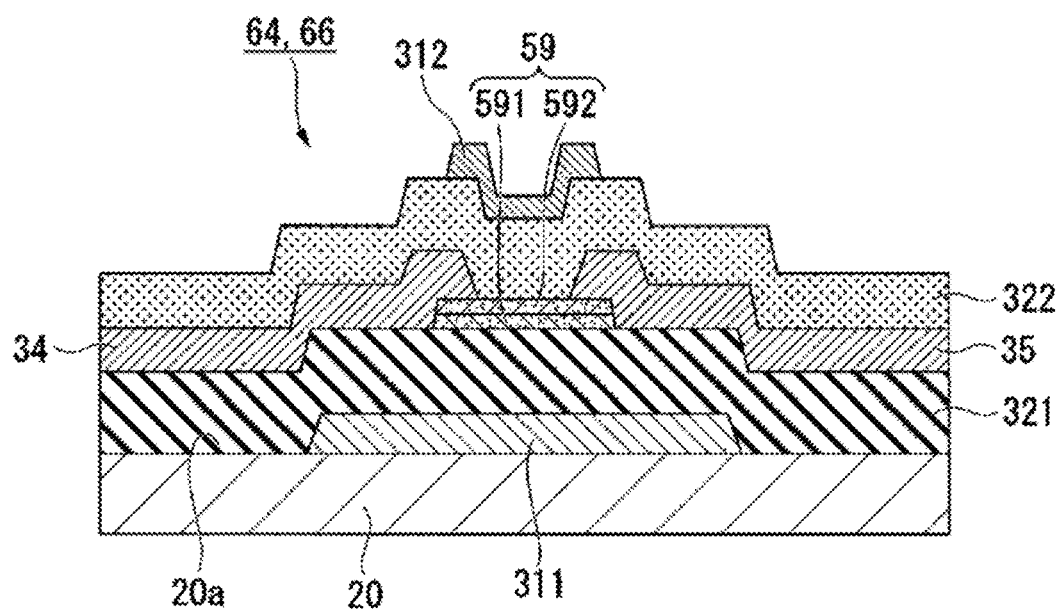
FIG. 9B is a cross-sectional view taken along a line F-F in FIG. 9A.

FIG. 9A is a plan view illustrating a pattern of both a pixel portion TFT and a gate driver circuit TFT. FIG. 9B is a cross-sectional view taken along a line F-F in FIG. 9A.

In FIG. 8A to FIG. 9B, the same components as those in the drawings used in the first embodiment are denoted by the same reference signs, and descriptions thereof will be omitted.

As illustrated in FIG. 8A, in a TFT 68 of the split switch circuit 18, the oxide semiconductor layer 53 including the second oxide semiconductor layer 531, the third oxide semiconductor layer 532, and the fourth oxide semiconductor layer 533 is provided to overlap a first gate electrode 311. A portion of the source electrode 34 and a portion of the drain electrode 35 are provided to overlap a portion of the oxide semiconductor layer 53. A second gate electrode 312 is provided to overlap a portion of the first gate electrode 311, a portion of the oxide semiconductor layer 53, and a portion of the source electrode 34 and a portion of the drain electrode 35.

As illustrated in FIG. 8B, the TFT 68 of the split switch circuit 18 includes the first gate electrode 311, a first gate insulating layer 321, the oxide semiconductor layer 53, the source electrode 34, the drain electrode 35, a second gate insulating layer 322, and the second gate electrode 312. In other words, the TFT 68 of the present embodiment has a double gate structure. The configuration of the oxide semiconductor layer 53 is the same as that of the TFT 48 of the split switch circuit 18 in the second embodiment.

The first gate electrode 311 is formed on the first surface 20a of the substrate 20. The first gate insulating layer 321 is formed on the first surface 20a of the substrate 20 to cover the first gate electrode 311. The second gate insulating layer 322 is formed to cover the source electrode 34 and the drain electrode 35. The second gate electrode 312 is formed at a position above the oxide semiconductor layer 53 with the second gate insulating layer 322 interposed therebetween.

As illustrated in FIG. 9A, in each of TFTs 64 and 66 of the pixel portion 15 and the gate driver circuit 16, respectively, the oxide semiconductor layer 59 is provided to overlap the first gate electrode 311. A portion of the source electrode 34 and a portion of the drain electrode 35 are provided to overlap a portion of the oxide semiconductor layer 59. The second gate electrode 312 is provided to overlap a portion of the first gate electrode 311, a portion of the oxide semiconductor layer 59, and a portion of the source electrode 34 and a portion of the drain electrode 35.

As illustrated in FIG. 9B, each of the TFTs 64 and 66 of the pixel portion 15 and the gate driver circuit 16, respectively, includes the first gate electrode 311, the first gate insulating layer 321, the oxide semiconductor layer 59, the source electrode 34, the drain electrode 35, the second gate insulating layer 322, and the second gate electrode 312. In other words, the TFTs 64 and 66 of the present embodiment has a double gate structure. The configuration of the oxide semiconductor layer 59 is the same as that of each of the TFTs 44 and 46 of the pixel portion 15 and the gate driver circuit 16, respectively in the second embodiment. Other configurations are the same as those in the first embodiment.

In the present embodiment as well, similar effects to those of the first embodiment can be obtained, such as a reduced occupancy area of the split switch circuit 18 and realizing the liquid crystal display device 1 having a narrow bezel and low power consumption.

Furthermore, in the case of the present embodiment, since the TFT 64, 66, and 68 have the double gate structure, an effect that the ON-currents of the TFTs 64, 66, and 68 increase can be obtained, and the ON-currents of the TFT 64, 66, and 68 can be set to approximately twice, for example, depending on the configuration of the protection layer 36 or the like.

Fourth Embodiment

Hereinafter, a fourth embodiment of the disclosure will be described with reference to FIG. 10A and FIG. 10B.

A basic configuration of the active matrix substrate of the present embodiment is the same as that of the first embodiment, and a configuration of the TFT is different from that of the first embodiment.

Figure 10A:
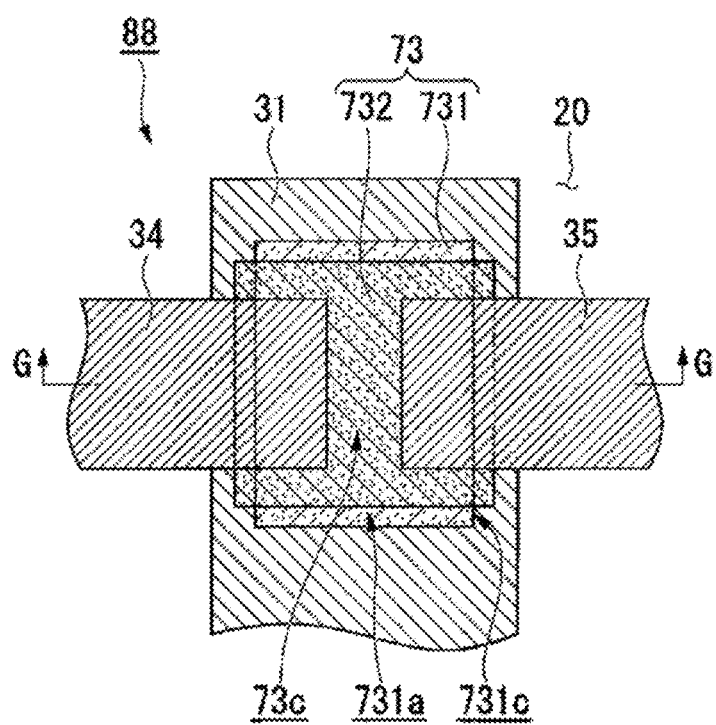
FIG. 10A is a plan view illustrating a pattern of a split switch circuit TFT in an active matrix substrate of a fourth embodiment.

FIG. 10A is a plan view illustrating a pattern of a split switch circuit TFT in an active matrix substrate of the fourth embodiment. FIG. 10B is a cross-sectional view taken along a line G-G in FIG. 10A.

Figure 10B:
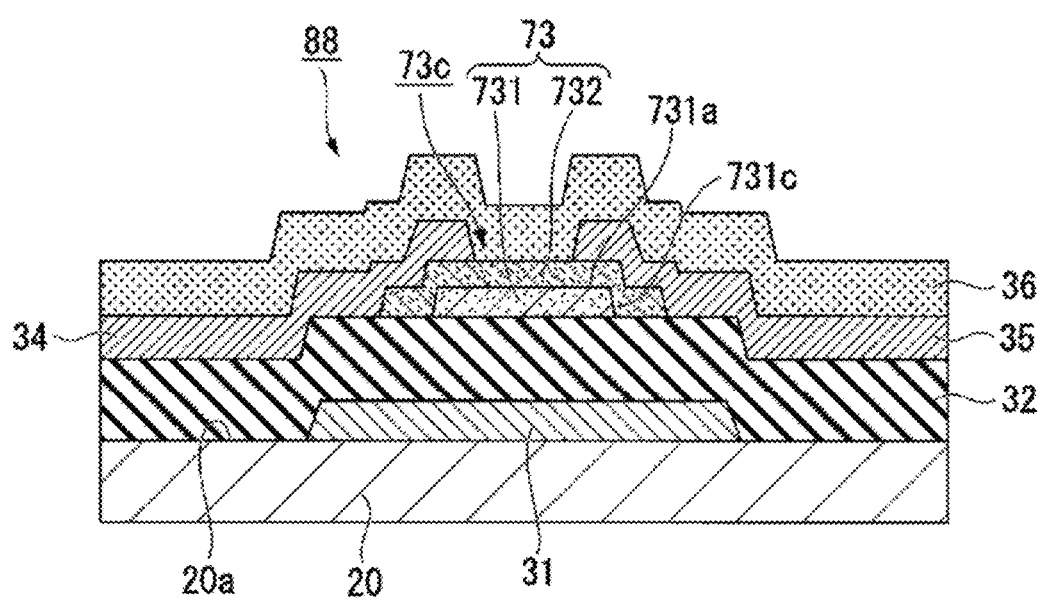
FIG. 10B is a cross-sectional view taken along a line G-G in FIG. 10A.

Note that in FIG. 10A and FIG. 10B, the same components as those in the drawings used in the first embodiment are denoted by the same reference signs, and descriptions thereof will be omitted.

A pattern of a TFT 88 of the split switch circuit 18 illustrated in FIG. 10A is analogous to the pattern of the TFT 28 of the split switch circuit 18 in the first embodiment illustrated in FIG. 4A. However, in the TFT 28 of the first embodiment, the third oxide semiconductor layer 332 covers all of the upper face 331a and all of the edge face 331c of the second oxide semiconductor layer 331, whereas in the TFT 88 of the present embodiment, a third oxide semiconductor layer 732 covers a portion of an upper face 731a and a portion of an edge face 731c of a second oxide semiconductor layer 731.

As illustrated in FIG. 10B, as described above, the configuration of TFT 88 of the present embodiment differs from that of the TFT 28 of the first embodiment, but is similar in a cross-sectional structure to the TFT 28 of the first embodiment only in viewing a cross-sectional structure along a line G-G in FIG. 10A.

In the present embodiment, a portion (end portion) of the upper face 731a and a portion (end portion) of the edge face 731c of the second oxide semiconductor layer 731 are not covered by the third oxide semiconductor layer 732. However, in the center portion of the second oxide semiconductor layer 731 which has the greatest effect on the characteristics of the TFT 88, that is, near a channel region 73c, the upper face 731a and the edge face 731c are covered by the third oxide semiconductor layer 732, and therefore, the effect according to the first embodiment can be obtained that a liquid crystal display device has a narrow bezel and low power consumption can be realized.

Note that the technical scope of the disclosure is not limited to the embodiments above, and various additional modifications may be made without departing from the spirit of the disclosure.

For example, in the embodiments described above, a channel etched type TFT is used for the TFT as an example, but a channel stop type TFT or a top gate type TFT may be used, for example. In addition, the number, shape, size, disposition, material, and the like of the components constituting the liquid crystal display device specifically described above are not limited to those illustrated in the above embodiments, and changes can be made as appropriate.

The active matrix substrate of the above-described embodiments is not limited to a liquid crystal display device, and may be used in a display device such as an organic electroluminescence display device, for example.

INDUSTRIAL APPLICABILITY

Some aspects of the disclosure can be applicable to various display devices such as liquid crystal display devices, organic electroluminescence display devices, and the like.

REFERENCE SIGNS LIST

1 Liquid crystal display device (display device)
6 Active matrix substrate
15 Pixel portion
16 Gate driver circuit
17 Source driver IC
18 Split switch circuit
22 Pixel electrode
24, 44, 64 TFT (pixel portion, first thin film transistor)
28, 48, 68 TFT (split switch circuit, second thin film transistor)
33, 53, 59 Oxide semiconductor layer
39, 591 First oxide semiconductor layer
331, 531, 731 Second oxide semiconductor layer
332, 532, 732 Third oxide semiconductor layer
533 Fourth oxide semiconductor layer

The invention claimed is:

1. An active matrix substrate comprising:
a pixel portion including a plurality of gate lines and a plurality of source lines intersecting each other, and a plurality of pixel electrodes provided in a matrix corresponding to the intersections between the plurality of gate lines and the plurality of source lines; and
a split switch circuit configured to split a signal from a source driver to supply to the plurality of source lines, wherein
the pixel portion includes a first thin film transistor including a first oxide semiconductor layer,
the split switch circuit includes a second thin film transistor including a second oxide semiconductor layer and a third oxide semiconductor layer,
the third oxide semiconductor layer covers at least a portion of an upper face and a portion of an edge face of the second oxide semiconductor layer, and
a threshold voltage of the second thin film transistor is less than a threshold voltage of the first thin film transistor.

2. An active matrix substrate comprising:
a pixel portion including a plurality of gate lines and a plurality of source lines intersecting each other, and a plurality of pixel electrodes provided in a matrix corresponding to the intersections between the plurality of gate lines and the plurality of source lines; and a split switch circuit configured to split a signal from a source driver to supply to the plurality of source lines, wherein the pixel portion includes a first thin film transistor including a first oxide semiconductor layer, the split switch circuit includes a second thin film transistor including a second oxide semiconductor layer and a third oxide semiconductor layer, the third oxide semiconductor layer covers at least a portion of an upper face and a portion of an edge face of the second oxide semiconductor layer, and a threshold voltage of the second thin film transistor is a negative value.

3. The active matrix substrate according to claim 2, wherein a threshold voltage of the first thin film transistor is a positive value.

4. A display device comprising the active matrix substrate according to claim 1.

5. A display device comprising the active matrix substrate according to claim 2.

* * * * *